United States Patent
McShea et al.

(10) Patent No.: US 8,970,276 B1
(45) Date of Patent: Mar. 3, 2015

(54) CLOCK SIGNAL SYNCHRONIZATION

(71) Applicants: Matthew D. McShea, Summerfield, NC (US); Scott G. Bardsley, Gibsonville, NC (US); Peter Derounian, Greensboro, NC (US)

(72) Inventors: Matthew D. McShea, Summerfield, NC (US); Scott G. Bardsley, Gibsonville, NC (US); Peter Derounian, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/109,262

(22) Filed: Dec. 17, 2013

(51) Int. Cl.
*H03H 11/26* (2006.01)
*H03L 7/087* (2006.01)

(52) U.S. Cl.
CPC .................................. *H03L 7/087* (2013.01)
USPC ............ 327/269; 327/263; 327/201; 327/200

(58) Field of Classification Search
USPC ......................... 327/105–123, 141, 144–163; 331/15–17; 375/373–376
See application file for complete search history.

(56) References Cited

U.S. PATENT DOCUMENTS

| | | | |
|---|---|---|---|
| 5,036,528 A | | 7/1991 | Costantino et al. |
| 5,818,890 A | * | 10/1998 | Ford et al. ..................... 375/371 |
| 6,144,374 A | * | 11/2000 | Hyun .............................. 345/204 |
| 7,378,885 B1 | * | 5/2008 | Kossel ........................... 327/115 |
| 7,826,579 B2 | | 11/2010 | Hwang et al. |
| 8,295,419 B2 | | 10/2012 | Hwang et al. |
| 8,344,769 B2 | * | 1/2013 | Adachi .......................... 327/156 |
| 2006/0199408 A1 | * | 9/2006 | Hoisington et al. ........... 439/108 |

* cited by examiner

*Primary Examiner* — Brandon S Cole
(74) *Attorney, Agent, or Firm* — Kenyon & Kenyon LLP

(57) ABSTRACT

Circuits and methods are introduced to allow for timing relationship between a clock signal and a synchronization signal to be observed. The observations may include observing the timing relationship between a capture edge of the clock signal and a transition of the synchronization signal. Based on the observations the timing of the synchronization signal transition may be adjusted. Observing the timing relationship may include providing a delayed synchronization signal and a delayed clock signal. The delayed synchronization signal may provide what happens before the capture edge of the clock signal. The delayed clock signal may provide what happens after the capture edge of the clock signal.

21 Claims, 7 Drawing Sheets

100

200

500

600

CLOCK SIGNAL SYNCHRONIZATION

FIELD

The subject matter of this application is directed to clock synchronization in circuit systems, and more particularly to synchronization of clock signals provided to multiple chips.

BACKGROUND

In electronic systems, there is often a need to control the timing of events. Within a single integrated circuit (e.g., a chip) this may be accomplished by providing an external clock signal or by generating a clock signal internally. When events in multiple circuits need to be coordinated, the same clock signal may be provided to the multiple circuits. Due to variations in the circuits and paths of the clock signals to these circuits, the clock signals at each circuit may drift over time and need to be synchronized. Also internal circuits such as clock multiplier or divider circuits may start up with different initial conditions. In both cases, a synchronization signal may periodically synchronize these clock signals.

In order to successfully synchronize the clock signal to the synchronization signal, the timing relationship between the synchronize signal and the clock signal needs to adhere to certain timing constrains. The timing constraints may be influenced by a setup and hold time of the components performing the synchronization. The setup and hold time may define a window of time around a trigger event of the clock signal. During this setup and hold time, the synchronization signal should be stable in order for the synchronization signal to provide consistent results. If the synchronization signal is unstable during this period—if, for example, it transitions within the setup and hold time—then a component may not generate a reliable output. For example, two circuits that receive the clock and synchronization signals under the same conditions and ideally would generate identical outputs, may generate different outputs due to manufacturing differences between the circuit (process variation) or due to ambient operation conditions. To ensure that consistent results are provided, signal transitions should occur outside of the setup and hold window.

However, as clock frequencies increase, maintaining proper timing alignment between clock signals and the synchronize signal becomes increasingly difficult. This may be due to part-to-part differences among circuits and variations in the environmental factors (e.g., temperature and supply voltage) that may cause circuits to behave differently.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

DETAILED DESCRIPTION

Embodiments of the present invention provide circuits and methods to regulate timing relationships between a clock signal and a synchronization signal. Specifically, the timing relationship between a capture edge of the clock signal and a transition of the synchronization signal may be controlled to ensure synchronization notwithstanding timing constraints of the circuit. Determining the timing relationship between the capture edge of the clock signal and transition of the synchronization signal may include providing a delayed synchronization signal and a delayed clock signal and comparing how the delayed signals change performance of the circuit. The changes to the output using the delayed synchronization signal may provide what happens before the capture edge of the clock signal. The changes to the output using the delayed clock signal may provide what happens after the capture edge of the clock signal. The disclosed circuits and methods may test and adjust the timing relationships on fast clock signals (e.g., clock signals exceeding 1 Ghz).

Figure 1:
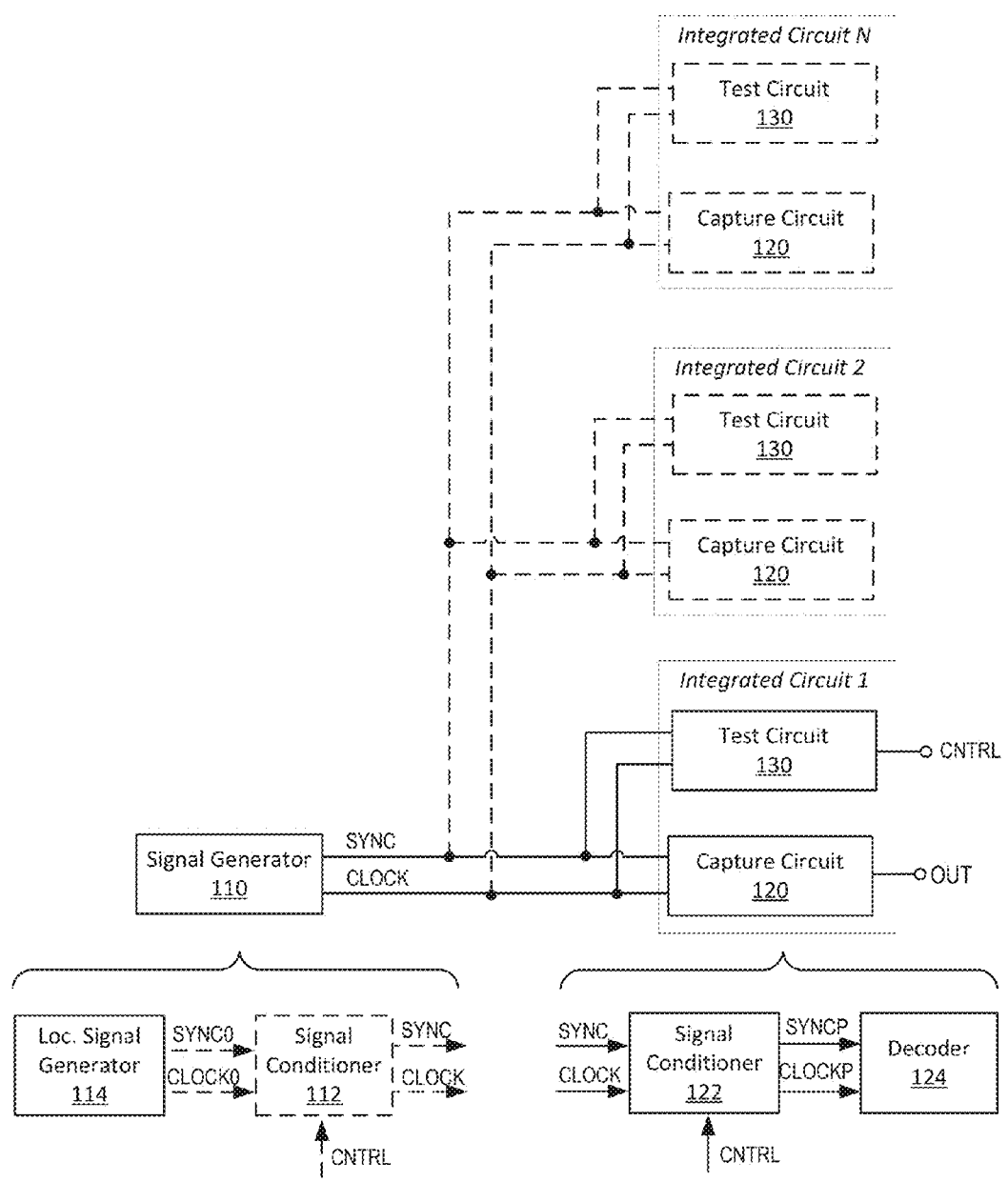
FIG. 1 illustrates a circuit 100 for capturing a synchronization signal according to an embodiment of the present invention.

FIG. 1 illustrates a circuit 100 for capturing a synchronization signal according to an embodiment of the present invention. The circuit 100 may include a signal generator 110, a capture circuit 120, and a test circuit 130. The signal generator 110 may provide a clock signal CLOCK and a synchronization signal SYNC to the capture circuit 120. The capture circuit 120 may generate an output signal OUT representing a time, relative to transitions in the clock signal CLOCK, at which the SYNC signal is detected at the capture circuit 120. Typically, the signal generator 110 will be separated from the capture circuit 120 by a sufficient distance to create uncertainty whether proper synchronization between the CLOCK and SYNC signals will be maintained. The test circuit 130, as its name implies, may perform tests upon the CLOCK and SYNC circuits to determine relationships among them and, based on results of those tests, may generate control signals CNTRL that control processing of the capture circuit 120.

The output signal OUT may generate a transition that indicates a transition of the synchronization signal SYNC between two states (e.g., a low level signal and a high level signal) during a particular cycle of the clock signal CLOCK. Thus, the capture circuit 120 may "capture" the synchronization signal SYNC during the particular cycle of the clock signal CLOCK. The output signal OUT may transition between two states (e.g., low level output signal and a high level output signal) to indicate the capture of the synchronization signal SYNC.

The output signal OUT may be used by other circuit stage(s) (not shown) to perform some processing operation. The other circuit stages may be provided on a common integrated circuit (e.g., chip) with the capture circuit 120 or it may be provided in another integrated circuit. For example, the output signal OUT may trigger a transmission event by a communication device (not shown) in which the capture circuit 120 is provided.

The test circuit 130 may receive the SYNC and CLOCK signals and determine whether timing relationships between the SYNC and CLOCK signals violate timing constraints of the circuit 100. If the timing constraints are violated, the test circuit 130 may provide a control signal CNTRL to the signal generator 110 and/or the capture circuit 120 to adjust the skew between the SYNC and CLOCK signals.

For example, timing constraints of the capture circuit 120 may be violated when the clock signal CLOCK and the synchronization signal SYNC both transition within a "set up and hold time" of each other, which is defined for the capture circuit 120. In the example, discussed above, where the SYNC signal is sampled on predetermined transitions of the CLOCK signal, the setup and hold time may be defined relative to these transitions of the CLOCK signal. The test circuit 130 may determine whether transitions of the SYNC signal occur within the setup and hold time of CLOCK signal and, optionally, may identify relationships between the SYNC and CLOCK signal for correction.

In an embodiment, the capture circuit 120 may include a signal conditioner 122 and a decoder 124. The signal conditioner 122 may receive SYNC and CLOCK signals and adjust skew between the SYNC and CLOCK signals (if needed) based on the control signal CNTRL from the test circuit 130. The signal conditioner 122 may adjust the skew between the SYNC and CLOCK signals by delaying one of the SYNC and CLOCK signals with respect to the other. Adjusted SYNCP and CLOCKP signals may be provided to the decoder 124. The decoder 124 may generate the output signal OUT based on the SYNCP and CLOCKP signals that are input to it. The decoder 124 may generate output signal OUT representing a time at which the SYNCP signal is detected relative to transitions in the clock signal CLOCKP. In an embodiment, the decoder 124 may be a flip-flop circuit.

As illustrated in FIG. 1, the capture circuit 120 and the test circuit 130 may be provided in a common integrated circuit. Thus, the test circuit 130 may generate control data CTRL that enable synchronization between the CLOCK and SYNC signals observed locally at the integrated circuit in which the capture circuit 120 resides. A system 100 may include multiple integrated circuits, shown as 1-N in FIG. 1, each of which may include its own test circuit 130 to generate local control data CTRL to enable synchronization between the CLOCK and SYNC signals observed locally at each of the integrated circuits 1-N.

In another embodiment, a signal conditioner 112 may be provided as part of the signal generator 110. In this embodiment, signal generator 110 include a local signal generator 114 and the signal conditioner 112. The local signal generator may generate an original synchronization signal SYNCO and an original clock signal CLOCKO according to its own techniques. The signal conditioner 112 may alter timing between the original synchronization signal SYNCO and an original clock signal CLOCKO based on control signal(s) received from the test circuit(s) 130 in the system 100. The signal conditioner 112 may output the SYNC and CLOCK signals to the circuit(s) in the system 100. In this embodiment, the test circuit 130 receiving the adjusted SYNCP and CLOCKP signals may confirm that the correct adjustments are made to the SYNC and CLOCK signals.

Figure 2:
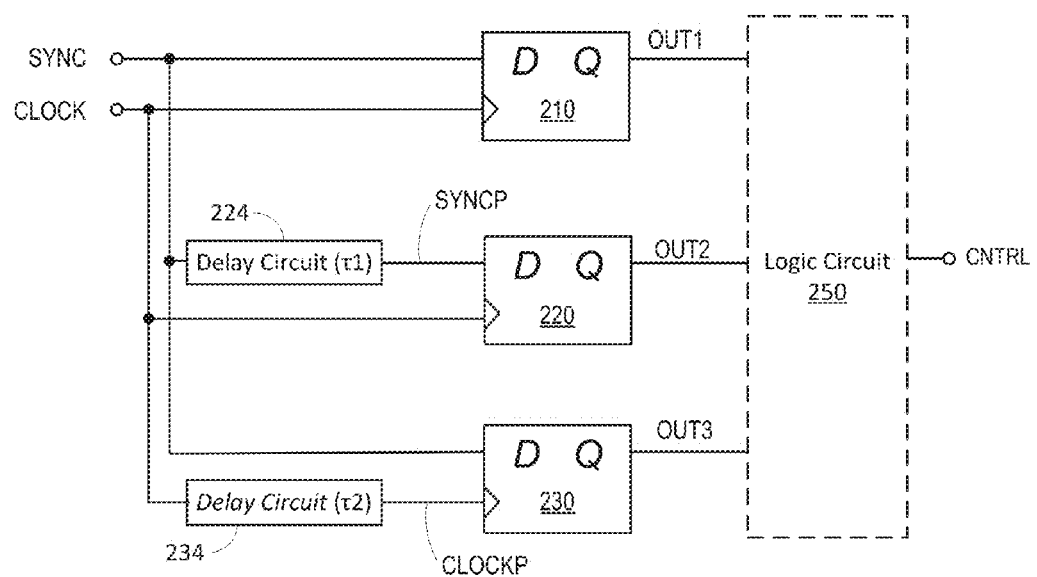
FIG. 2 illustrates a test circuit that may test timing relationship of the synchronization and the clock signals according to an embodiment of the present invention.

FIG. 2 illustrates a test circuit 200 that may test timing relationship of the synchronization and the clock signals, according to an embodiment of the present invention. The test circuit 200 may include a plurality of flip-flop circuits 210, 220 and 230, a first delay circuit 224 and a second delay circuit 234. The first delay circuit 224 may delay a synchronization signal SYNC by delay τ1 to provide a delayed synchronization signal SYNCP. The second delay circuit 234 may delay a clock signal CLOCK by delay τ2 and provide a delayed clock signal CLOCKp.

A first flip-flop circuit 210 may receive the clock signal CLOCK and the synchronization signal SYNC and provide an output OUT1 representing a time at which the SYNC signal is detected relative to transitions in the clock signal CLOCK. A second flip-flop circuit 220 may receive the clock signal CLOCK and the delayed synchronization signal SYNCP and provide an output OUT2 representing a time at which the SYNCP signal is detected relative to transitions in the clock signal CLOCK. A third flip-flop circuit 230 may receive the delayed clock signal CLOCKP and the synchronization signal SYNC and provide an output OUT3 representing a time at which the SYNC signal is detected relative to transitions in the delayed clock signal CLOCKP. In one embodiment, the first flip-flop circuit 210 may correspond to the capture circuit 120 shown in FIG. 1.

A logic circuit 250 may interpret outputs from the flip-flops 210-230 to assess a timing relationship between the SYNC and CLOCK signals. In one embodiment, the logic circuit 250 may receive data patterns as shown in Table 1, which represents whether transitions in the SYNC signal precede capture transitions of the CLOCK signal by or whether they follow capture transitions of the CLOCK signal, by the delay amounts imposed by the delay circuits 224, 234.

TABLE 1

|  | SYNC PRECEDES CLOCK (BY τ1) | SYNC FOLLOWS CLOCK (BY τ2) |
| --- | --- | --- |
| OUT1 | 0 | 1 |
| OUT2 | 1 | 1 |
| OUT3 | 0 | 0 |

Delays imposed by the delay circuits 224, 234 may be tuned to limitations that are expected to be found in an associated capture circuit 120 (FIG. 1). Thus, the outputs OUT1, OUT2 and OUT3 may be provided to a logic circuit 250 to determine whether timing constraints of the circuit are violated. If the timing constraints of the circuit are violated, the logic circuit 250 may send a control signal CNTRL to adjust the skew between the CLOCK and SYNC signals. The determination of whether the timing constraints of the circuit are violated may include determining whether a SYNC signal transitioning before a capture edge (e.g., rising or falling edge) of the clock signal CLOCK violates the timing constraints and whether the SYNC signal transitioning after a capture edge of the clock signal CLOCK violates the timing constraints. The logic circuit 250 may compare the output OUT1 to the output OUT2 to determine whether the SYNC signal transitioning before a capture edge of the clock signal CLOCK potentially violates the timing constraints. The logic circuit 250 may compare the output OUT1 to the output OUT3 to determine whether the SYNC signal transitioning after the capture edge of the clock signal CLOCK potentially violates the timing constraints.

Figure 3A:
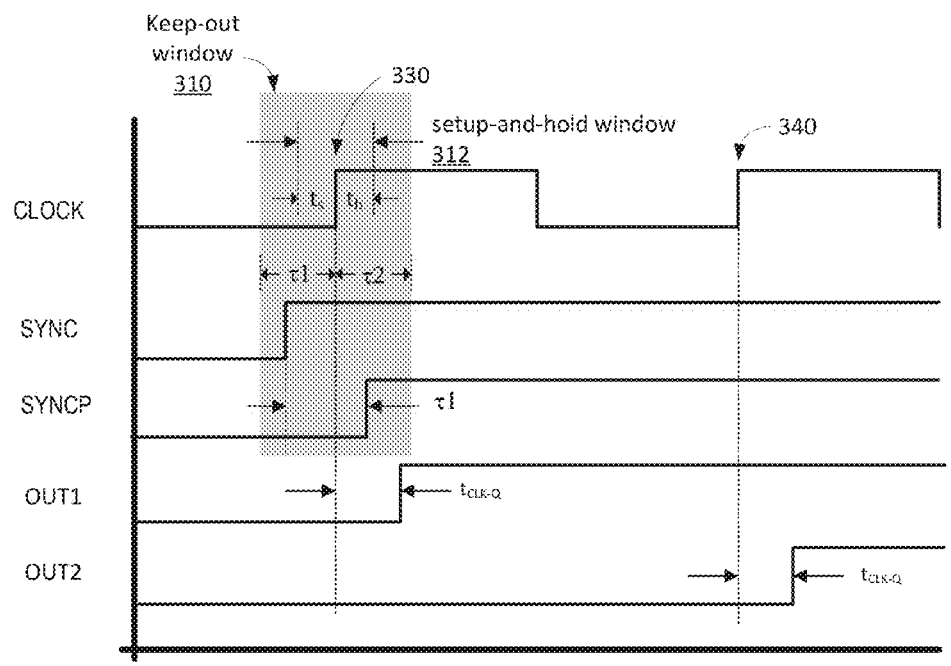
FIGS. 3A-4C illustrate exemplary timing diagrams that may occur in the test circuit shown in FIG. 2.
Figure 3B:
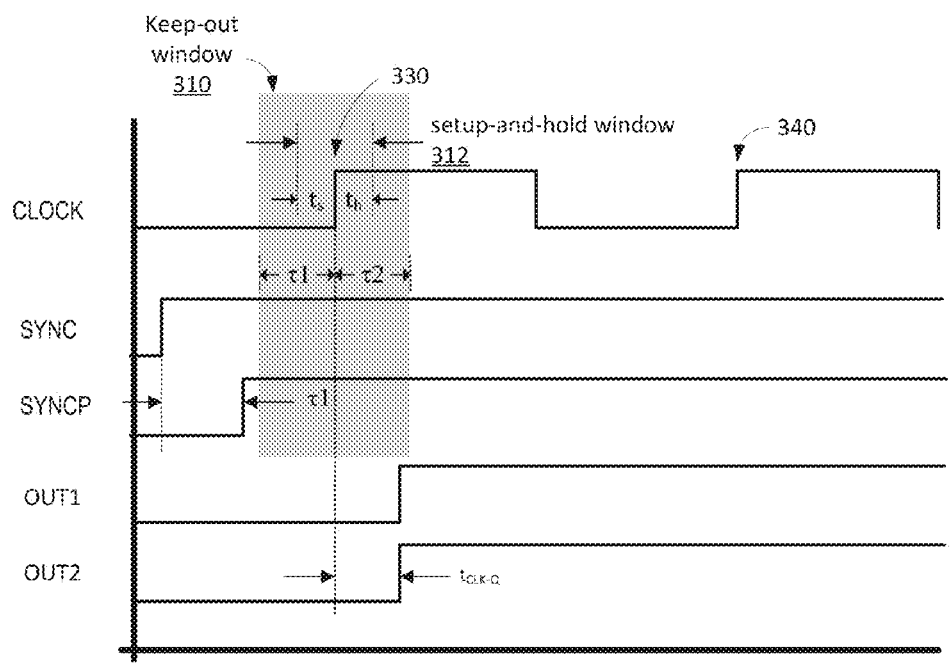
Figure 3C:
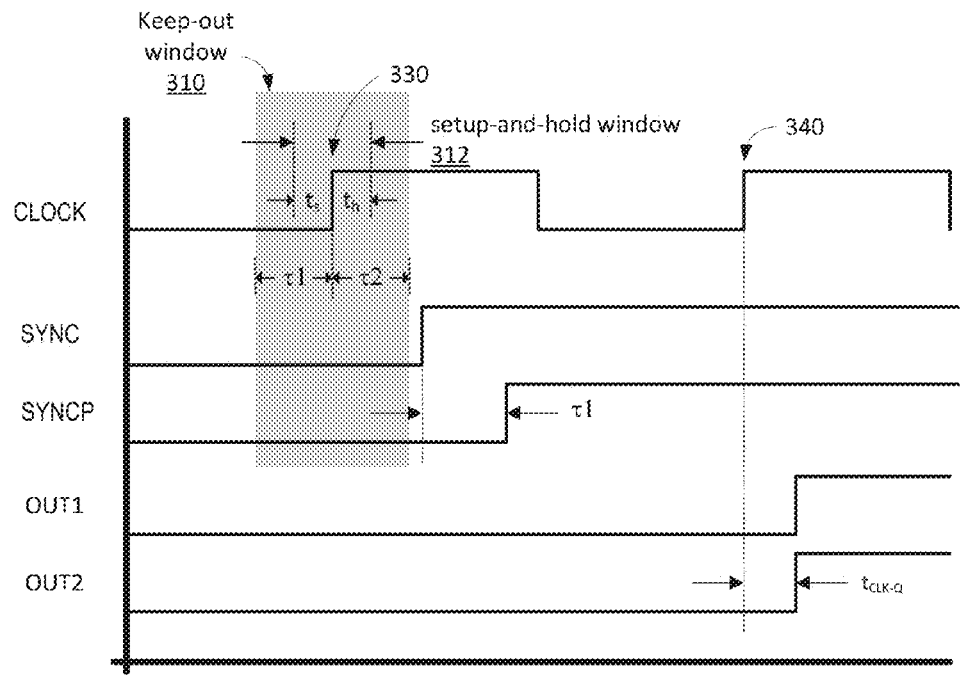

FIGS. 3A-3C illustrate exemplary timing diagrams that may occur in the test circuit 200 for outputs OUT1 and OUT2. As discussed above, the outputs OUT1 and OUT2 may indicate whether the SYNC signal transitioning before the capture edge of the clock signal CLOCK violates the timing constraints.

In FIGS. 3A-3C, the output OUT1 is generated by a flip flop 210 representing a state of the SYNC signal as detected on a capture edge (e.g., capture edge 330 or 340) of the CLOCK signal. Similarly, output OUT2 is generated by a flip flop 210 representing a state of the delayed SYNC signal (SYNCP) as detected on a capture edge (e.g., capture edge 330 or 340) of the CLOCK signal. The SYNC signal is delayed by delay τ1 to provide a delayed SYNC signal.

The delay τ1 may be tuned to a setup-and-hold time of the capture circuit 120 (FIG. 1) and therefore may allow the test circuit 200 to determine if the SYNC signal transitions occur too close to the capture transitions of the CLOCK signal to meet the timing requirements of the capture circuit 120. In one embodiment, the delay τ1 may equal half of the keep-out window 310. In another embodiment, the delay τ1 may equal half of the setup-and-hold window 312 or the setup time $t_s$ of the setup-and-hold window 312.

The setup and hold window 312 of the capture circuit may include two components, a setup time $t_s$ and a hold time $t_h$. The setup time $t_s$ of the capture circuit may include the minimum amount of time that the synchronization signal SYNC should be held steady before the clock signal CLOCK transitions (e.g., at the rising edge or at the falling edge). The hold time $t_h$ of the capture circuit 120 may include the minimum amount of time the synchronization signal SYNC should be held steady after the clock signal CLOCK transitions (e.g., at the rising edge or at the falling edge).

In another embodiment, the predefined keep-out window 310 may correspond to a difference in time the same CLOCK signal and/or the SYNC signal are received and processed at different parts of the circuit. The time difference may be due to the differences in the propagation delay of the CLOCK and SYNC signals to these different parts of the circuit. The propagation delay may be different due to circuit components (e.g., different tracings and different capture circuits) and/or variations in environmental factors (e.g., temperature or supply voltage).

In one embodiment, the predefined keep-out window 310 may correspond to a larger value of the setup and hold window 312 of the capture circuit and the expected time differences due to the propagation delay.

In the example of FIG. 3A, the SYNC signal precedes the CLOCK signal but is within a time τ1 of the capture transition of CLOCK signal. The outputs OUT1 and OUT2 from the flip flops 210, 220 may indicate this situation. Output OUT1 represents the SYNC signal being captured at the capture edge 330 and output OUT2 represents the delayed SYNC signal being captured at the capture edge 340. Thus, the outputs OUT1 and OUT2 transitioning in different cycles of the CLOCK signal may indicate that the SYNC signal transitions within the keep-out window 310 before the capture edge of the clock signal. After being captured, the outputs OUT1 and OUT2 are shown as being delayed by $t_{CLK-Q}$ due to inherent delays in the circuit components.

FIGS. 3B and 3C illustrate an exemplary timing diagram for outputs OUT1 and OUT2 that may indicate the SYNC and CLOCK signals not violating the timing constraints. As shown in FIGS. 3B and 3C, the outputs OUT1 and OUT2 may both transition at approximately the same time and within the same cycle of the CLOCK signal. Both of the outputs OUT1 and OUT2 transitioning within the same cycle of the CLOCK signal, may indicate that the transition of the SYNC signal is outside of the keep-out window 310 centered at the captured edge of the CLOCK signal. In FIG. 3B, both SYNC signal and delayed SYNCP signal transition are captured by capture edge 330. In FIG. 3C, both SYNC signal and delayed SYNCP signal transition are captured by capture edge 340.

Figure 4A:
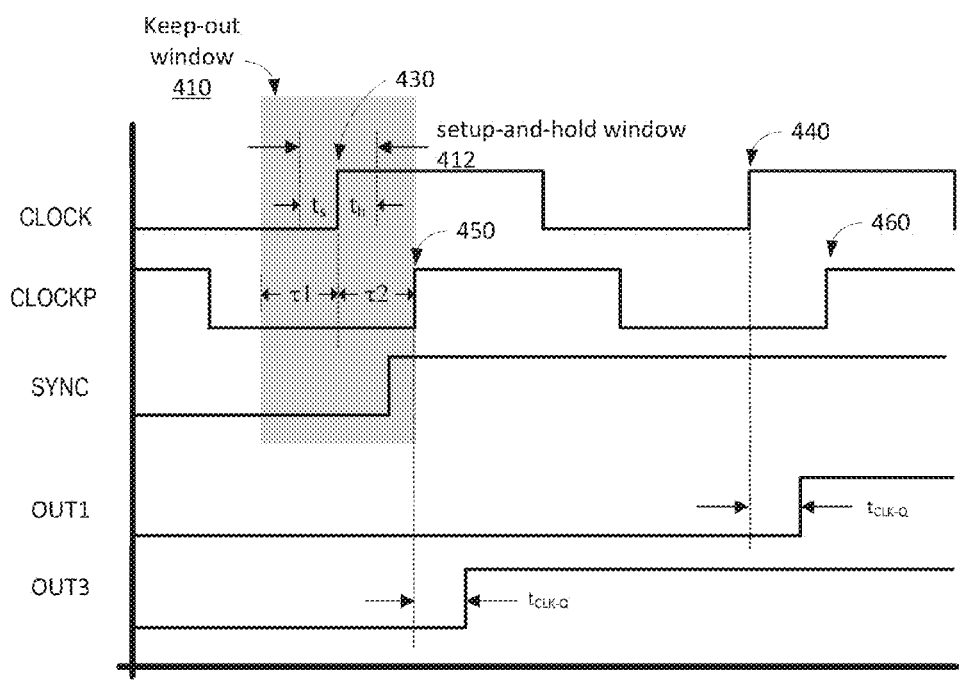
Figure 4B:
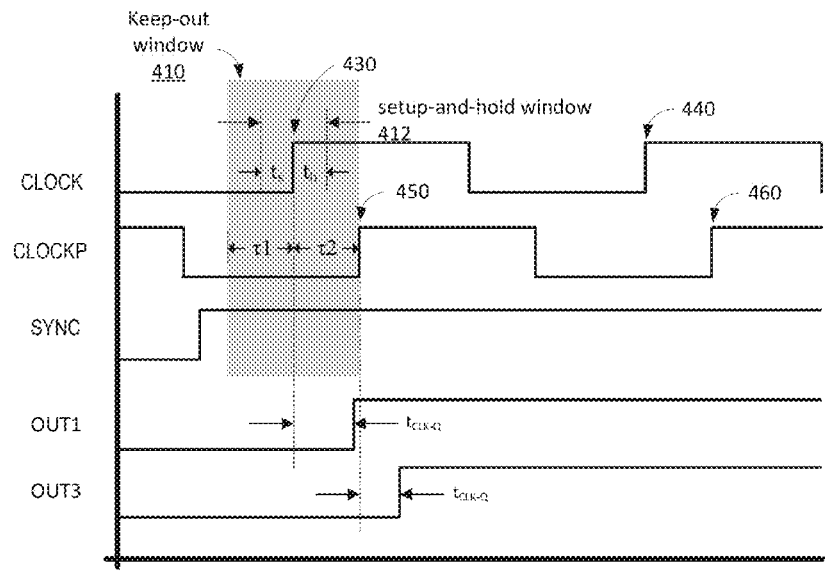
Figure 4C:
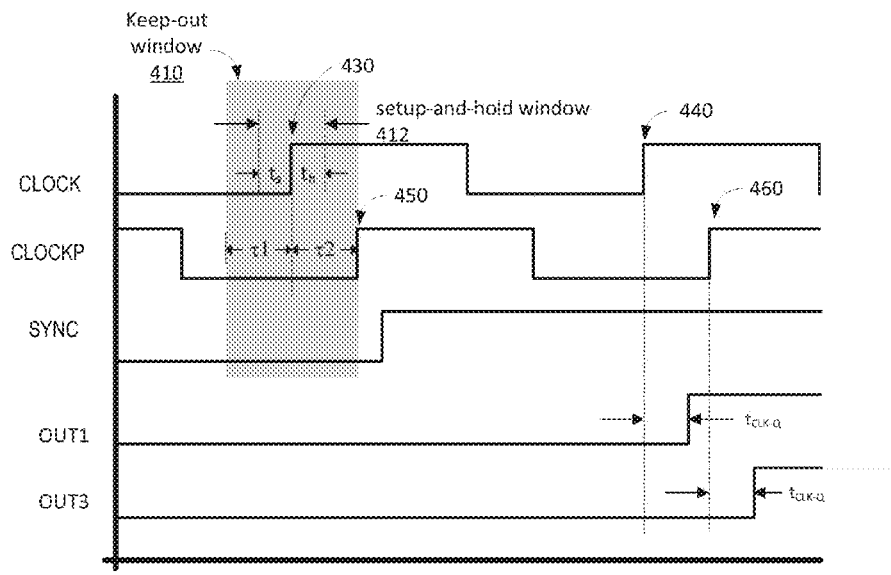

FIGS. 4A-4C illustrate exemplary timing diagrams that may occur in the test circuit 200 for outputs OUT1 and OUT3. As discussed above, the outputs OUT1 and OUT3 may indicate whether the SYNC signal transitioning after the capture edge of the clock signal CLOCK violates the timing constraints.

In FIGS. 4A-4C, the output OUT1 represents a time at which the SYNC signal is detected relative to a capture edge (e.g., capture edge 430 or 440) of the CLOCK signal. Output OUT3 represents a time at which the SYNC signal is detected relative to a capture edge (e.g., capture edge 450 or 460) of the delayed clock signal CLOCKP. The clock signal CLOCK is delayed by delay τ2 to provide a delayed clock signal CLOCKP. The delay τ2 may correspond to a portion of the keep-out window 410, which may include the setup-and-hold window 412. In one embodiment, the delay τ2 may equal half of the keep-out window 410. In another embodiment, the delay τ2 may equal half of the setup-and-hold window 412 or the hold time $t_h$ of the setup-and-hold window 412.

In FIG. 4A, the outputs OUT1 and OUT3 transitioning in different cycles of the CLOCK signal may indicate a violation of the timing constraints. Output OUT1 represents the SYNC signal being captured at the capture edge 440 of the CLOCK signal and output OUT3 represents the SYNC signal being captured at the capture edge 450 of the delayed clock signal CLOCKP. Thus, the outputs OUT1 and OUT3 transitioning in different cycles of the CLOCK signal may indicate that the SYNC signal transitions within the keep-out window 410 after the capture edge (e.g., capture edge 430) of the CLOCK signal. After being captured, the outputs OUT1 and OUT3 are shown as being delayed by $t_{CLK-Q}$ due to inherent delays in the circuit components.

FIGS. 4B and 4C illustrate an exemplary timing diagram for outputs OUT1 and OUT3 that may indicate the SYNC and CLOCK signals not violating the timing constraints. As shown in FIGS. 4B and 4C, the outputs OUT1 and OUT3 may both transition within the same cycle of the CLOCK signal. The transition of the outputs OUT1 and OUT3 may be offset merely by the delay τ2. Both of the outputs OUT1 and OUT3 transitioning within the same cycle of the CLOCK signal, may indicate that the transition of the SYNC signal is outside of the keep-out window 410 centered at the captured edge of the CLOCK signal. In FIG. 4B, the SYNC signal is captured by capture edge 430 of the CLOCK signal to provide output OUT1, and SYNC signal is captured by capture edge 450 of the delayed CLOCK signal to provide output OUT3. In FIG. 4C, the SYNC signal is captured by capture edge 440 of the CLOCK signal to provide output OUT1, and SYNC signal is captured by capture edge 460 of the delayed CLOCK signal to provide output OUT3.

If based on the outputs OUT1, OUT2 and OUT3 it is determined that SYNC signal transitions within the keep-out window of the circuit (e.g., case shown in FIG. 3A or FIG. 4A), the logic circuit 250 may send a control signal CNTRL to adjust the skew between the CLOCK and SYNC signals. The skew between the CLOCK and SYNC signals may be adjusted (e.g., increased) until all of the outputs OUT1, OUT2 and OUT3 transition within the same clock cycle. Table 2 lists the states of the outputs OUT1, OUT2 and OUT3 and the actions that may be taken for each of the states.

TABLE 2

| State of Outputs | Condition of Timing Violation | Action |
| --- | --- | --- |
| OUT1, OUT2 and OUT3 transition within the same clock cycle. | No violation: Transition of SYNC signal outside of the keep-out window. | None |
| OUT1 and OUT2 transition in different clock cycles. | Violation: Transition of SYNC signal is before the capture edge of the CLOCK signal and within the keep-out window. | Adjust Skew |
| OUT1 and OUT3 transition in different clock cycles. | Violation: Transition of SYNC signal is after the capture edge of the CLOCK signal and within the keep-out window. | Adjust Skew |

Adjusting the skew between the CLOCK signal and the SYNC signal may include providing a delay to the CLOCK signal or the SYNC signal. In one embodiment, if it is determined that the transition of SYNC signal is before the capture edge of the CLOCK signal and within the keep-out window (e.g., outputs OUT1 and OUT2 transition in different clock cycles), the CLOCK signal may be delayed by a predetermined delay. If it is determined that the transition of the SYNC signal is after the capture edge of the CLOCK signal and within the keep-out window (e.g., outputs OUT1 and OUT3 transition in different clock cycles), the SYNC signal may be delayed by a predetermined delay.

As shown in FIG. 2, the synchronization signal SYNC may drive the D-input of a flip-flop circuit and the clock signal CLOCK may drive the CLK-input of the flip-flop circuit.

The delay $\tau 1$ may be set to the value of a setup time of a capture circuit provided by the manufacturer and/or to the expected variations in the delay of clock at different parts of the circuit. The delay $\tau 2$ may be set to the value of the hold time provided by the manufacturer and/or to the expected variations in the delay of clock at different parts of the circuit. In one embodiment, the delay $\tau 1$ may be set to a multiple of the setup-and-hold window 312 or a multiple of the setup time $t_s$ of the setup-and-hold window 312. For example, the delay $\tau 1$ may be set to three times the setup time $t_s$ of the setup-and-hold window 312. In another embodiment, the delay $\tau 2$ may be set to a multiple of the setup-and-hold window 312 or a multiple of the hold time $t_h$ of the setup-and-hold window 412. For example, the delay $\tau 2$ may be set to three times the hold time $t_h$ of the setup-and-hold window 412. In other embodiments, the delay $\tau 1$ may be set to a value that is smaller than the setup time $t_s$ and/or the delay $\tau 2$ may be set to a value that is smaller than the hold time $t_h$ to observe operation of the capture circuit with SYNC signal transitions within the setup-and-hold window.

While the rising edge is used in the illustrated embodiments to capture the transition of the synchronization signal, in other embodiments the falling edge may be used as the capture edge. Similarly, the synchronization signal may transition from a high value to a low value in other embodiments.

In FIGS. 3A-4C the outputs OUT1, OUT2 and OUT3 may represent the operation of the capture circuit under ideal operation. The capture circuit may depart from the ideal operation and behave unpredictably when, for example, the delayed SYNCP signal transitions within the setup-and-hold window of the clock CLOCK signal or the SYNC signal transitions within the setup-and-hold window of the delayed clock CLOCKP. Multiple tests may be performed to take account for unpredictable behaving of the capture circuits under these conditions. In other embodiments, the delay $\tau 1$ and/or delay $\tau 2$ may be increased to reduce the unpredictable behaving of the capture circuits due to the delayed SYNCP or CLOCKP signals.

Figure 5:
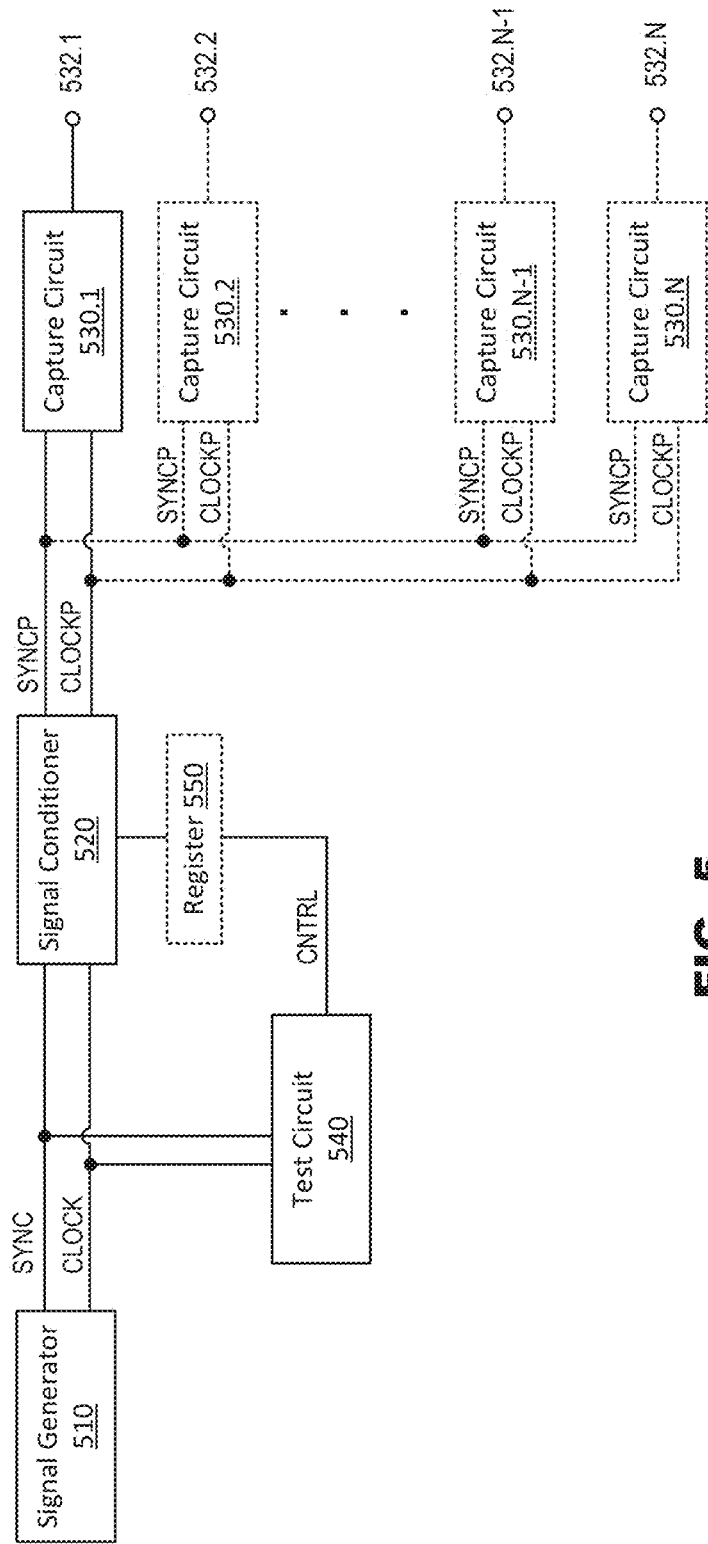
FIG. 5 illustrates a circuit to test and provide clock and synchronization signals to one or more circuits according to an embodiment of the present invention.

FIG. 5 illustrates a circuit 500 to test and provide clock and synchronization signals to one or more circuits according to an embodiment of the present invention. The circuit 500 may include a signal generator 510, a signal conditioner 520, a capture circuit 530.1, and a test circuit 540.

The signal generator 510 may generate and provide a clock signal CLOCK and a synchronization signal SYNC to the signal conditioner 520. The signal conditioner 520 may adjust the skew between the clock signal CLOCK and the synchronization signal SYNC, and provide the adjusted signals SYNCP and CLOCKP to the capture circuit 530.1. The capture circuit 530.1 may generate an output signal 532.1 representing a time at which the SYNCP signal is detected at the capture circuit 530.1 relative to the transitions in the clock signal CLOCKP. The output signal 532.1 may be used by other circuit stage(s) (not shown) to perform some processing operation.

The test circuit 540 may receive the SYNC and CLOCK signals and determine whether timing relationships between the SYNC and CLOCK signals violate timing constraints of the circuit 500. If the timing constraints are violated, the test circuit 540 may provide a control signal CNTRL to the signal conditioner 520 to adjust the skew between the SYNC and CLOCK signals. For example, the signal conditioner 520 may delay or advance the synchronization signal SYNC such that the transiting of the synchronization signal SYNC is outside of the keep-out window of the circuit 500. The test circuit 540 may correspond to the test circuit shown in FIG. 2.

In one embodiment, the circuit 500 may include a register 550 to store adjustments that may be made to the skew between the SYNC and CLOCK signals based on the control signals received from the test circuit 540.

As shown in FIG. 5, the circuit 500 may optionally include one or more additional capture circuits 530.2-530.N providing output signals 532.2-532.N, based on the values of the clock signal CLOCKP and the synchronization signal SYNCP. Each of the outputs 532.1-532.N of the capture circuits 530.1-530.N may be provided to different circuit stage(s) (not shown) and/or chips. In one embodiment, the capture circuits 530.1-530.N may be part of different circuit stages and/or chips.

The test circuit 540 may determine whether skew between the CLOCK and SYNC signal should be adjusted to ensure that the timing constraints of the capture circuits 530.1-530.N are satisfied. The variations in the capture circuits 530.1-530.N and/or the traces to these capture circuit 530.1-530.N may influence the keep-out window used by the test circuit 540. The setup and hold time of the capture circuits 530.1-530.N used in the keep-out window of the circuit 500 may be values provided by the manufacturer. In one embodiment, the keep-out window may equal the setup and hold time of the capture circuit 530.1-530.N with the maximum value. In another embodiment, the keep-out window may equal the average value of the setup and hold times of the capture circuits 530.1-530.N.

Each capture circuit 530.1-530.N may include one or more flip-flop or latch circuits. The capture circuits 530.1-530.N may be a D-type flip-flop receiving the clock signal CLOCK at the clock input and receiving the synchronization signal SYNC at the D-input.

In one embodiment, the clock signal CLOCK and the synchronization signal SYNC may be generated by different circuits. In another embodiment, the clock signal CLOCK and the synchronization signal SYNC may be generated by a master chip and provided to a plurality of slave chips. The synchronization signal SYNC may be controlled to periodically transition between the two states to periodically synchronize the clock signal(s). In other embodiments, the transition of the synchronization signal SYNC may be trigged by an event. For example, the transition of the synchronization signal SYNC may be trigged by an event on the master chip. The synchronization signal SYNC may reset a plurality of chips at start up, as each chip may start up in an unpredictable phase.

Figure 6:
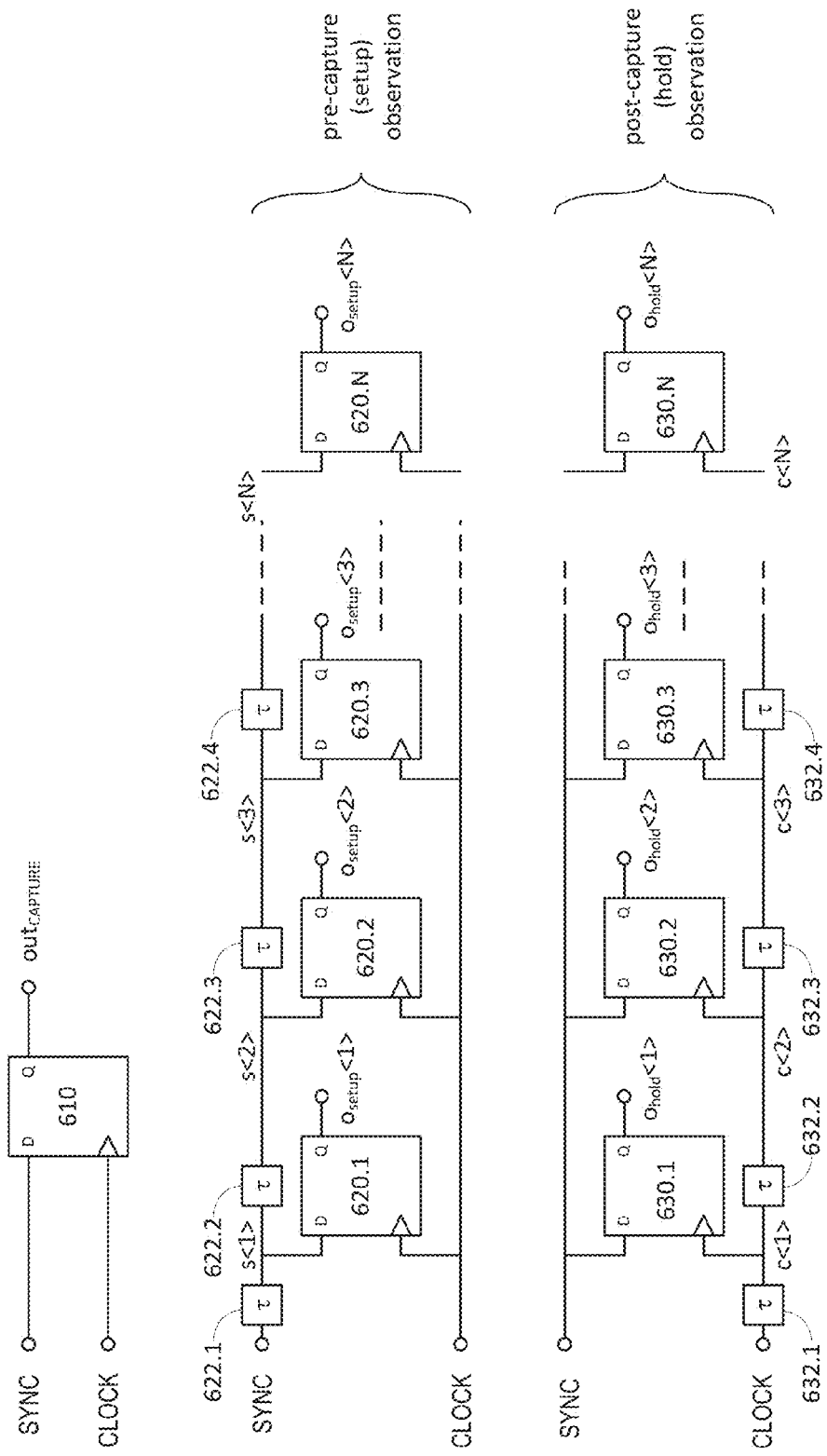
FIG. 6 illustrates a circuit to test timing relationships of a clock signal and synchronization signal according to another embodiment of the present invention.

FIG. 6 illustrates a circuit 600 to test timing relationships of a clock signal and synchronization signal according to another embodiment of the present invention. The circuit 600 may include a main capture circuit 610, a first set of capture circuits 620.1-620.N connected in series, a second set of capture circuits 630.1-630.N connected in series, a plurality of synch delay circuits 622.1-622.N and plurality of clock delay circuits 632.1-632.N.

The main capture circuit 610 may receive a clock signal and a synchronization signal, and provide an output signal $OUT_{CAPTURE}$ based on the values of the clock signal and the synchronization signal. The first set of capture circuits 620.1-620.N may receive the clock signal and delayed synchronization signals s<1-N>, and provide outputs $O_{SETUP}$<1-N> based on the input signals. The second set of capture circuits 630.1-630.N may receive delayed clock signals c<1-N> and synchronization signal, and provide outputs $O_{HOLD}$<1-N> based on the input signals. The plurality of synch delay circuits 622.1-622.N may receive the synchronization signal and provide the delayed synchronization signals s<1-N> to the first set of capture circuits 620.1-620.N. The plurality of clock delay circuits 632.1-632.N may receive the clock signal and provide the delayed clock signals c<1-N> to the second set of capture circuits 630.1-630.N.

Observations of the outputs $O_{SETUP}$<1-N> and outputs $O_{HOLD}$<1-N> may provide whether the SYNC signal transitions within a keep-out window centered at a capture edge of the clock signal. For example, observations of the outputs $O_{SETUP}$<1-N> may indicate a synchronization signal transition before the capture edge of the clock signal and may indicate a potential setup-time violations. Observations of the outputs $O_{HOLD}$<1-N> may indicate a synchronization signal transition after the capture edge of the clock signal and may indicate a potential hold-time violations. The outputs $O_{SETUP}$<1-N> and outputs $O_{HOLD}$<1-N> may provide whether the skew between SYNC and CLOCK signal should be adjusted. In addition, the outputs $O_{SETUP}$<1-N> and outputs $O_{HOLD}$<1-N> may provide how much (e.g., minimum amount) the skew should be adjusted to avoid potential timing violations. The output of the capture circuit 610, outputs $O_{SETUP}$<1-N> and outputs $O_{HOLD}$<1-N> may be provided to a logic circuit to determine the amount of delay to provide to the SYNC signal or the CLOCK signal.

In one embodiment, the outputs of the capture circuit 610 may be compared to the outputs $O_{SETUP}$<1-N> and outputs $O_{HOLD}$<1-N> to determine the minimum amount of delay that is needed until the output $O_{CAPTURE}$ from the capture circuit 610, one of the outputs $O_{SETUP}$<1-N> and one of the outputs $O_{HOLD}$<1-N> all transition within the same clock cycle.

As shown in FIG. 6, each delay circuit part of the delay circuits 622.1-622N and 632.1-632.N may provide an additional preset delay to the received signal. The number of capture circuits and delay circuits connected in series may be extended to provide the desired level of information on the timing relationship between the capture edge and the synchronization signal. Similarly, the amount of delay provided by each delay circuit may be adjusted to provide the desired level of information on the timing relationship. In one embodiment, each delay circuit may provide the same amount of preset delay. In another embodiment, the amount of delay provided by each circuit may be different (e.g., the delay provided by each subsequent delay circuit connected in series may be reduced).

In one embodiment, the delay circuits 622.1-622.N and/or 632.1-632.N may each provide a delay that is a fractional part of the setup and/or hold time of the capture circuit, and the total amount of delay in the path of the delay circuits 622.1-622.N or in the path of the delay circuits 632.1-632.N may exceed the setup or hold time and/or the predefined keep-out window. In this embodiment, the outputs $O_{SETUP}$<1-N> and outputs $O_{HOLD}$<1-N> may indicate the precise transition of the synchronization signal relative to the capture edge of the clock, anywhere within the observation window defined by the path of the delay circuits.

The circuit 600 may also observe the drift in the skew between the clock signal and the synchronization signal. The enhanced resolution of the observations provided by the first set of capture circuits 620.1-620.N and the second set of capture circuits 630.1-630.N may provide the user with how much and how quickly the skew changes. The outputs $O_{SETUP}$<1-N> and outputs $O_{HOLD}$<1-N> may be provided to a logic circuit that may reset the synchronization signal and/or the clock signal when the skew between the clock signal and the synchronization signal exceeds a predetermined limit.

The delay circuits shown in FIGS. 2 and 6 may be part of the circuit generating the clock signals and/or the synchronization signals. In another embodiment, the delay circuits may be separate circuits. For example, the delay circuits may be implemented using a programmable delay circuit, a buffer chain circuit, flip-flop circuit, a buffer and/or an inverter digital logic element.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations described herein may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A method for determining a timing relationship between transitions of a clock signal and a synchronization signal at a receiver, the method comprising:
   delaying the clock signal by a first predetermined amount;
   delaying the synchronization signal by a second predetermined amount;
   comparing a time of a predetermined transition of the synchronization signal to a time of a predetermined transition of the clock signal;
   comparing a time of the predetermined transition of the delayed synchronization signal to a time of the predetermined transition of the clock signal;
   comparing a time of the predetermined transition of the synchronization signal to a time of the predetermined transition of delayed clock signal; and
   based on the three comparisons, adjusting a delay of either the synchronization signal or the clock signal at an input of the receiver.

2. The method of claim 1, wherein the three comparisons are performed with circuitry each having their own set up and hold times.

3. The method of claim 1, further comprising, upon conclusion of the method, storing delay settings of the input of the receiver in persistent memory.

4. The method of claim 1, wherein, when the comparisons indicate that the predetermined transition of the clock signal occurs after the predetermined transition of the synchronization signal but before the predetermined transition of the delayed synchronization signal, a delay of the synchronization at the input of the receiver is increased.

5. The method of claim 1, wherein, when the comparisons indicate that the predetermined transition of the synchronization signal occurs after the predetermined transition of the clock signal but before the predetermined transition of the delayed clock signal, a delay of the clock at the input of the receiver is increased.

6. The method of claim 1, further comprising, performing the method recursively, wherein, when the comparisons indicate that the predetermined transition of the clock signal occurs after both the predetermined transition of the synchronization signal and the predetermined transition of the delayed synchronization signal, the method terminates.

7. The method of claim 1, further comprising, performing the method recursively, wherein, when the comparisons indicate that the predetermined transition of the synchronization signal occurs after both the predetermined transition of the clock signal and the predetermined transition of the delayed clock signal, the method terminates.

8. A method for adjusting a skew between a clock signal and a synchronization signal, the method comprising:
   generating the clock signal and the synchronization signal;
   generating a delayed clock signal having a first delay;
   generating a delayed synchronization signal having a second delay;
   providing a first output signal representing a time at which the synchronization signal transitions relative to capture edges in the clock signal;
   providing a second output signal representing a time at which the delayed synchronization signal transitions relative to the capture edges in the clock signal
   providing a third output signal representing a time at which the synchronization signal transitions relative to capture edges in the delayed clock signal;
   comparing the first output signal and the second output signal to determine whether the synchronization signal transitions before a capture edge of the clock signal;
   comparing the first output signal and the third output signal to determine whether the synchronization signal transitions after the capture edge of the clock signal; and
   based on the comparisons, adjusting the skew between the synchronization signal and the clock signal.

9. The method of claim 8, wherein the first output signal and the second output signal are compared to determine whether the synchronization signal transitions during the first delay preceding the capture edge of the clock signal.

10. The method of claim 9, wherein the first output signal and the second output signal provide transitions in different cycles of the clock signal when the synchronization signal transitions during the first delay.

11. The method of claim 8, wherein the first output signal and the third output signal are compared to determine whether the synchronization signal transitions during the second delay following the capture edge of the clock signal.

12. The method of claim 11, wherein the first output signal and the third output signal provide transitions in different cycles of the clock signal when the synchronization signal transitions during the second delay.

13. The method of claim 8, wherein the timing of the transition of the synchronization signal is adjusted such that transition occurs outside of a keep-out window including the first delay and the second delay.

14. The method of claim 13, wherein the keep-out window is centered at the capture edge of the clock signal.

15. The method of claim 8, wherein the first delay includes the setup time of a capture circuit providing the output signals, and the second delay includes the hold time of the capture circuit.

16. The method of claim 8, wherein each of the first delay and the second delay include a time of skew between clock signals provided to different circuit components.

17. A synchronization circuit, comprising:
   a first capture circuit providing a first output signal representing a time at which a synchronization signal transitions relative to a predetermined edge in a clock signal;
   a first delay circuit providing a delayed synchronization signal;
   a second delay circuit providing a delayed clock signal;
   a second capture circuit providing a second output signal representing a time at which the delayed synchronization signal transitions relative to the edge in the clock signal;
   a third capture circuit providing a third output signal representing a time at which the synchronization signal transitions relative to the edge in the delayed clock signal;
   a circuit for comparing the first output signal and the second output signal to determine whether the synchronization signal transitions before the edge of the clock signal, and for comparing the first output signal and the third output signal to determine whether the synchronization signal transitions after the edge of the clock signal.

18. The circuit of claim 17, further comprising a receiver circuit to receive the synchronization signal and the clock signal and having a programmable delay element at its input, storing a delay value based on results of the comparisons.

19. The circuit of claim 17, further comprising a generator circuit to generate the synchronization signal and the clock signal and having a programmable delay element at its output, storing a delay value based on results of the comparisons.

20. The synchronization circuit of claim 17, wherein:
   the synchronization signal is delayed by a first delay to provide the delayed synchronization signal;

the clock signal is delayed by a second delay to provide the delayed clock signal;

the first output signal and the second output signal are compared by the comparing circuit to determine whether the synchronization signal transitions during the first delay preceding the capture edge of the clock signal; and the first output signal and the third output signal are compared to determine whether the synchronization signal transitions during the second delay following the capture edge of the clock signal.

21. The synchronization circuit of claim 20, wherein:

the first output signal and the second output signal provide transitions in different cycles of the clock signal when the synchronization signal transitions during the first delay; and the first output signal and the third output signal provide transitions in different cycles of the clock signal when the synchronization signal transitions during the second delay.

\* \* \* \* \*